United States Patent [19]
Grunleitner et al.

[11] 3,829,708
[45] Aug. 13, 1974

[54] TRANSISTOR SWITCHING CIRCUIT ARRANGEMENT FOR AN INDUCTIVE D-C CIRCUIT

[75] Inventors: Hans Grunleitner, Nurnberg; Hans Kuhnlein, Grossgrundlach; Manfred Liska, Nurnberg, all of Germany

[73] Assignee: Siemens Aktiengesellschaft, Munchen, Germany

[22] Filed: July 12, 1972

[21] Appl. No.: 270,924

[30] Foreign Application Priority Data

July 17, 1971 Germany .......................... 2135858

[52] U.S. Cl. .................. 307/202, 307/270, 307/315
[51] Int. Cl. .......................................... H03k 17/00
[58] Field of Search ........... 307/202, 314, 315, 293, 307/270; 317/148.5 R; 328/128

[56] References Cited

UNITED STATES PATENTS

| | | | |
|---|---|---|---|
| 3,038,106 | 6/1962 | Gutsogeorge et al. | 307/202 |
| 3,126,490 | 3/1964 | Stern | 307/270 X |
| 3,293,495 | 12/1966 | Smith | 307/202 X |
| 3,311,900 | 3/1967 | Gaunt, Jr. | 307/270 X |
| 3,597,635 | 8/1971 | Reich | 307/270 X |

FOREIGN PATENTS OR APPLICATIONS

| | | | |
|---|---|---|---|
| 1,153,831 | 9/1963 | Germany | 307/202 |

OTHER PUBLICATIONS

IBM Tech. Discl. Bulletin "Power Amplifier with Output Protect Circuit" by Lamoreaux Vol. 14, No. 3, 8/71 pg. 699.

*Primary Examiner*—Rudolph V. Rolinec
*Assistant Examiner*—B. P. Davis
*Attorney, Agent, or Firm*—Kenyon & Kenyon Reilly Carr & Chapin

[57] ABSTRACT

A transistor circuit arrangement for switching an inductive d-c circuit on and off is disclosed in which "secondary" breakdown of the transistor switch is prevented. The breakdown is caused by excess voltage at the transistor during the disconnecting of the inductive circuit. To prevent this, an integrating element, whose charging and discharging circuits are decoupled, is arranged between the collector and the base of a transistor. This permits the controlled charging of the integrator when the inductor is disconnected and an approximately constant voltage rise at the collector-emitter of the transistor.

4 Claims, 3 Drawing Figures

TRANSISTOR SWITCHING CIRCUIT ARRANGEMENT FOR AN INDUCTIVE D-C CIRCUIT

BACKGROUND OF THE INVENTION

1. Field of the Invention

The invention is concerned with a transistor circuit arrangement for switching an inductive d-c circuit.

In switching inductive d-c circuits by transistors, a so-called "second breakdown" may occur during the switching off of the circuit. This may lead to the destruction of the transistor because of the overvoltages which occur and the continued current flow in the transistor.

2. Description of the Prior Art

The previous method of preventing the occurrence of overvoltages was to use additional circuit elements in the load circuit, such as capacitors or Zener diodes. In order for these additional circuit elements to fulfill their purpose, they must be matched to the power rating of the load. This requires that these circuit elements must be made correspondingly large. The circuit elements, however, can be matched only for a given switching frequency, and thus they are not fully effective over the entire range of switching frequencies that for example, occur in a commutation device for d-c machinery.

It is therefore an object of the invention to design a transistor circuit arrangement for switching an inductive d-c circuit, in which no additional circuit elements are necessary in the load circuit and the "second breakdown" of the transistor is reliably prevented over the entire range of switching frequencies.

SUMMARY OF THE INVENTION

According to the invention, it is possible to solve the problem of the prior art by arranging an integrating element between the collector and the base of the transistor, the charging and discharging circuits of which are mutually decoupled.

In order to reduce the losses that occur when switching the inductive circuit on, it is advantageous if the time constant of the discharging circuit is substantially smaller than the time constant of the charging circuit.

According to a further embodiment of the invention, a simple transistor circuit arrangement is obtained by connecting a capacitor between the collector and the base of the transistor, and connecting the base of the transistor with the cathode of the diode, connected between a first and a second resistor, and connecting the resistors in series with the two terminals of a d-c voltage source. Matching of the transistor circuit arrangement to different load currents is easily accomplished by arranging an auxiliary voltage source between the second resistor and the corresponding terminal of the d-c voltage source. The adjustment of the transistor circuit arrangement for different currents thereby is facilitated if the auxiliary voltage source is adjustable.

BRIEF DESCRIPTION OF THE DRAWINGS

The subject of the invention will be described in further detail with reference to an example of an embodiment shown in the drawings in which:

FIG. 1 illustrates the characteristic of a transistor and different current-voltage curves when a inductive d-c circuit is switched off and on;

DESCRIPTION OF THE PREFERRED EMBODIMENT

Figure 1:
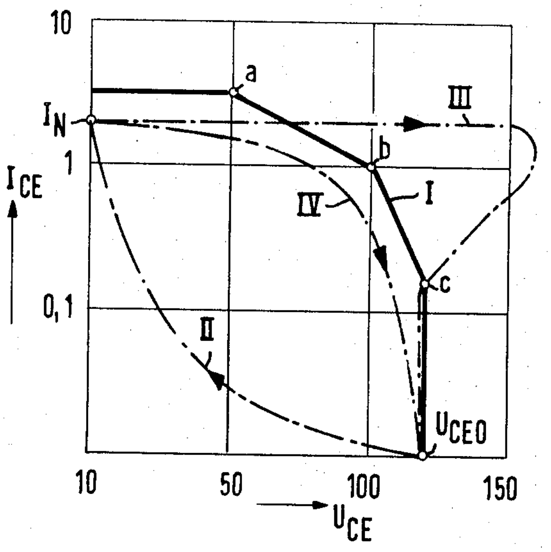

In FIG. 1 the characteristic of the transistor is designated by I. In order to prevent a breakdown in the transistor the current and voltage transients occuring during switching must not be allowed to exceed this characteristic. If an inductive d-c circuit is switched on, one obtains the current-voltage curve in FIG. 1 designated with II, which is safely below the characteristic of the transistor. The shape of the current-voltage curve designated III occurs upon switching off an inductive d-c circuit if no circuit elements are provided for limiting the voltage. As will be seen from FIG. 1, the current-voltage curve III exceeds the characteristic of the transistor, and a "second breakdown" of the transistor therefore occurs. If an inductive d-c circuit is switched off, and capacitors or Zener diodes are provided in the charging circuit to limit overvoltages, the current voltage curve designated IV is obtained. In this curve the characteristic of the transistor is not exceeded, and a "second breakdown" cannot occur.

Figure 2:
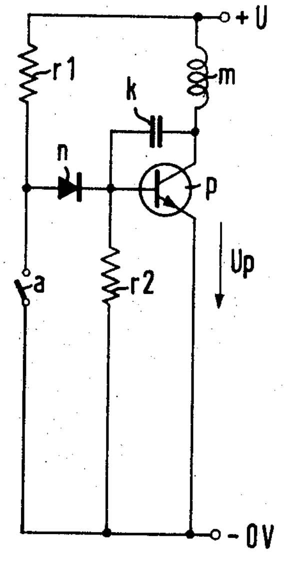
FIG. 2 illustrates a transistor circuit arrangement according to the invention.

In FIG. 2, an inductor *m* is connected by one terminal directly to the positive terminal +U, and its other terminal is connected to the negative terminal of a d-c voltage source through the collector-emitter path of a transistor p. In shunt with the inductor *m* and the transistor p, a series circuit is connected consisting of a first and second resistor, *r*1 and *r*2. A diode n is arranged between the two resistors. The base of the transistor p, is connected to the cathode of diode n and the first resistor *r*1 is connected to the anode of diode n. The common junction of the resistor *r*1 and the anode of diode n forms the control input. Between the control input and the negative terminal of the d-c voltage source a control switch *a* is connected. In place of the control switch *a* a transistor may also be provided. A capacitor *k* is connected between the collector and the base of the transistor p.

Figure 3:
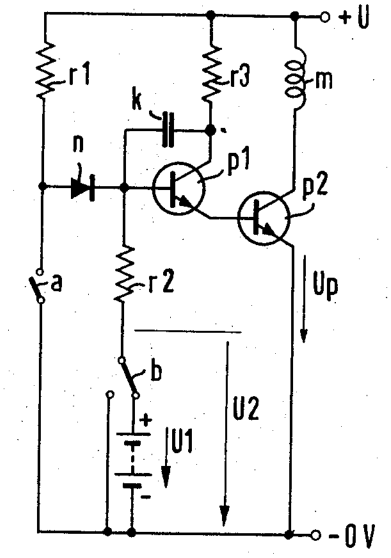
FIG. 3 illustrates a transistor circuit arrangement according to the invention in which an input transistor is connected with the main transistor, and an auxiliary voltage source is also employed.

In the example of the embodiment shown in FIG. 3, the inductor *m* is connected in series with a main transistor p2. The base of the main transistor p2 is connected with the emitter of an input transistor p1, the collector of which is connected with the positive terminal of the d-c voltage source through a collector resistor *r*3. Similar to the circuit arrangement of FIG. 2, the series circuit consisting of the first and second resistors, *r*1 and *r*2, with intermediate diode n, is again connected in shunt with the inductor *m* and the main transistor p2. An auxiliary voltage source consisting of voltage U1 is provided between the second resistor and the negative terminal of the d-c voltage source. The capacitor *k* is connected between the collector and the base of the input transistor p1, with the cathode of the diode n also connected to the base of input transistor p1. The common junction of the first resistor *r*1 and the anode of the diode n again constitutes the control input. The control switch *a* is again connected between the control input and the negative terminal of the d-c voltage source. The transistor circuit arrangement according to FIG. 3 therefore is distinguished merely by the amplifier circuit for the main transistor p2 and the additional auxiliary voltage source, the significance of which will be explained later. The auxiliary voltage source can also be provided, for example, in a transistor circuit arrangement according to FIG. 2 between the second resistor *r*2 and the negative terminal of the d-c voltage source.

If, in the transistor circuit arrangement according to FIG. 2, the control switch *a* is opened at a given point in time to connect the inductor *m*, transistor p is turned on by resistor *r*1. The capacitor *k* is then discharged at approximately constant current and causes a linear drop of the voltage across the collector-emitter path of transistor p. Transistor p is therefore not suddenly turned on when the control switch *a* is opened, but is turned on over a definite time interval. The time interval is dependent upon the time constant at which capacitor *k* discharges. Neglecting the control current of the transistor, this time constant is determined only by the first resistor *r*1 and the capacitor *k*.

If the inductor *m* is to be disconnected, the control switch *a* is closed. At this point capacitor *k* is charged with approximately constant current through the second resistor *r*2, and the voltage at the collector-emitter path of the transistor rises linearly. Through a proper selection of the charging time constant, a current-voltage curve can be obtained at transistor p, similar to that shown in curve IV of FIG. 1, if the inductor *m* is switched off. Because this current-voltage curve does not exceed the transistor characteristic at any point, no "second breakdown" of the transistor can occur.

The function of the transistor circuit arrangement according to FIG. 3 is in principle the same as in the transistor circuit arrangement according to FIG. 2. By using input transistor p1 the control signal for the main transistor p2 is merely amplified.

Because the current only increases slowly when an inductor is switched on (Curve II in FIG. 1), it is permissible to turn on the transistor within a very short time interval. The losses occurring when the circuit is switched on are thereby reduced. Since the time constant for charging is determined by the second resistor *r*2, this time constant can be chosen substantially larger than the time constant for the discharge, which is determined by the first resistor *r*1. For switching the inductance *m* off, a minimum time interval must be observed for turning on the main transistor p2 or the transistor p, in order to avoid the current-voltage curve exceeding the characteristic of the transistor. The minimum permitted time interval depends on the magnitude of the load current. If the minimum time interval is designed for switching a maximum load current, the time interval for switching the circuit off is too long for low load currents, and the switching losses again increase. The minimum time interval, in which the main transistor p2 or the transistor p, is switched on can be varied by the auxiliary voltage source connected between the second resistor *r*2 and the negative terminal of the d-c voltage source. The potential at the base of the input transistor p1 is changed by the auxiliary voltage U2, so that the time interval required for turning the input and main transistors p1 and p2 on is also changed thereby.

This design is particularly useful if the transistor circuit arrangement is used in an electronic commutation arrangement for d-c motors. To permit adjustment for the starting current, which is several times larger than tha nominal current, an appropriate minimum time interval for turning on the main transistor p2 is first adjusted through the auxiliary voltage U1. If after the acceleration process the starting current has decayed to the nominal current, the time interval for turning on the transistor can be changed to a value corresponding to the nominal current, for example, by disconnecting the auxiliary voltage U1 by means of a double-throw switch *b*. Matching to different currents is facilitated and can be done more accurately if the auxiliary voltage U1 is adjustable. By matching the time interval for turning on the transistor according to the respective load current, the switching losses are reduced to a minimum.

In the foregoing, the invention has been described in reference to specific exemplary embodiments. It will be evident, however, that variations and modifications, as well as the substitution of equivalent constructions and arrangements for those shown for illustration, may be made without departing from the broader scope and spirit of the invention as set forth in the appended claims. The specification and drawings are accordingly to be regarded in an illustrative rather than in a restrictive sense.

We claim:

1. A circuit for switching an inductive d-c load on and off using a transistor switch so as to avoid secondary breakdown of the transistor due to high transient voltages generated by the load comprising:

a. a transistor switch having its emitter-collector path in series with the load across a d-c source;
b. a capacitor connected between the base and collector of said transistor;
c. a first resistor coupling said base to one side of the d-c source;
d. a second resistor having its one end connected to the other side of said source and its other end connected through a switch to said one side of said source, the value of said second resistor being substantially greater than that of said first resistor;
e. a diode connecting the junction of said second resistor and said switch to said base having a polarity such as to permit said capacitor to be charged through said first resistor when said switch is open and discharged through said second resistor when said switch is closed.

2. A circuit for switching an inductive d-c circuit on and off as in claim 1 in which an auxiliary adjustable voltage source is arranged between the first resistor and the one side of the d-c voltage source to permit the adjustment of the voltage applied to the transistor with varying starting currents when the transistor is turned on and the inductive d-c circuit is turned on.

3. A circuit for switching an inductive d-c load on and off using a transistor switch so as to avoid secondary breakdown of the transistor due to high transient voltages generated by the load comprising:

a. a transistor switch having its emitter-collector path in series with the load across a d-c source;
b. an amplifier transistor having its emitter coupled to the base of said transistor switch and its collector coupled to said source;

c. a capacitor connected between the base and collector of said amplifier transistor;

d. a first resistor coupling said base to one side of the d-c source;

e. a second resistor having its one end connected to the other side of said source and its other end connected through a switch to said one side of said source, the value of said second resistor being substantially greater than that of said first resistor;

f. a diode connecting the junction of said second resistor and said switch to said base having a polarity such as to permit said capacitor to be charged through said first resistor when said switch is open and discharged through said second resistor when said switch is closed.

4. A circuit for switching an inductive d-c circuit on and off as in claim 3 in which an auxiliary adjustable voltage source is arranged between the first resistor and the one side of the d-c voltage source to permit the adjustment of the voltage applied to the transistor with varying starting currents when the transistor is turned on and the inductive d-c circuit is turned on.

* * * * *